United States Patent [19]

Chu et al.

[11] Patent Number: 4,792,460

[45] Date of Patent: Dec. 20, 1988

[54] METHOD FOR PRODUCTION OF POLYSILANES AND POLYGERMANES, AND DEPOSITION OF HYDROGENATED AMORPHOUS SILICON, ALLOYS THEREOF, OR HYDROGENATED AMORPHOUS GERMANIUM

[75] Inventors: Ting L. Chu; Shirley S. Chu, both of Dallas, Tex.

[73] Assignee: Electric Power Research Institute, Inc., Palo Alto, Calif.

[21] Appl. No.: 885,916

[22] Filed: Jul. 15, 1986

[51] Int. Cl.$^4$ .............................................. B05D 3/06
[52] U.S. Cl. ..................................... 427/35; 417/37; 417/39
[58] Field of Search ........................... 427/39, 37, 35

[56] References Cited

U.S. PATENT DOCUMENTS

| | | | |
|---|---|---|---|
| 3,824,121 | 7/1974 | Bradley et al. | 427/255.1 |
| 4,033,286 | 7/1977 | Chern et al. | 118/49 |
| 4,100,330 | 7/1978 | Donley | 428/429 |
| 4,353,788 | 10/1982 | Jeffrey et al. | 204/192.5 |
| 4,386,117 | 5/1983 | Gordon | 427/109 |
| 4,388,344 | 6/1983 | Shuskus et al. | 427/38 |
| 4,430,149 | 2/1984 | Berkman | 156/613 |
| 4,439,463 | 3/1984 | Miller | 427/8 |
| 4,491,604 | 1/1985 | Lesk et al. | 427/8 |
| 4,505,947 | 3/1985 | Vukanovic et al. | 427/37 |
| 4,509,451 | 4/1985 | Collins et al. | 118/50.1 |
| 4,525,382 | 6/1985 | Sugioka | 427/54.1 |
| 4,526,805 | 7/1985 | Yoshizawa | 427/38 |
| 4,539,068 | 9/1985 | Takagi et al. | 156/64 |
| 4,634,601 | 1/1987 | Hamawana et al. | 427/39 |

OTHER PUBLICATIONS

Spanier, et al., Inorganic Chem. 1, 432-433 (1962), "Conversion of Silane to Hefer Silanes in Silent Elect.".

Gau et al; appl., Phys. Ltr. 39, 436-438 (1981), "Prep. of Amorphous Silicon Filons by Chemical Vaper Deposition from Higher Silanes".

Delahoy et al., Proc. Soc. Photo-Optical Inst. Eng. vol. 47-54 (1983), "Prop of Hydrog. Amorphous Silicon Prep. by Chem. Vapor Depo. from Higher Silanes".

Ellis et al., J. Appl. Phys. 54, 5381-5384 (1983), "Simple Method of Prop. Hydrog. Amorphous Silicon Films by Chem. Vapor Depo at atmos. Pressure".

Ashida et al., Japan J. Appl. Phys., 23, <129-131 (1984), "Hydros. Amor. Silicon Prod. by Pyrolysis of Disilane in a Hot Wall Reactor".

Hegedus et al., Proc XVTI IEEE photor. Spec. Conf., 239-244 (1984), "CVD Amorphous Silicon Solar Cells".

*Primary Examiner*—Thurman K. Page
*Assistant Examiner*—L. R. Horne
*Attorney, Agent, or Firm*—Flehr, Hohbach, Test, Albritton & Herbert

[57] ABSTRACT

A process is provided for forming high purity polysilanes or polygermanes by electric discharge wherein the monosilane or monogermane is provided in a gaseous mixture with a carrier gas at atmospheric pressure. The polysilanes or polygermanes produced at atmospheric pressure are further deposited by various means onto a substrate as hydrogenated amorphous silicon or germanium. The polysilane may also be used for the deposition of hydrogenated amorphous silicon alloys.

10 Claims, 2 Drawing Sheets

FIG.—1

METHOD FOR PRODUCTION OF POLYSILANES AND POLYGERMANES, AND DEPOSITION OF HYDROGENATED AMORPHOUS SILICON, ALLOYS THEREOF, OR HYDROGENATED AMORPHOUS GERMANIUM

The present invention is directed to a method for producing polysilanes and polygermanes, and use thereof to deposit hydrogenated amorphous silicon or alloys thereof or hydrogenated amorphous germanium upon a substrate at high deposition rates. In one embodiment of the invention, crack free a-Si:H film of 20 μm thickness are typically attainable on glass or metal substrates.

BACKGROUND OF THE INVENTION

Hydrogenated amorphous silicon, hereinafter sometimes abbreviated as a-Si:H, is a useful semiconductor material which has applications, for example, in the formation of thin film solar arrays, photoreceptors for electrophotography, image sensors for facsimile transmission, fast detectors, switching diodes, and the like. Also, thin film alloys of hydrogenated amorphous silicon with other elements, such as carbon, germanium, nitrogen, fluorine, etc., are used in tandem solar cells. However, the methodology for producing films of hydrogenated amorphous silicon, and for producing the gaseous precursor materials, disilane and higher silanes (collectively hereinafter sometimes referred to as polysilanes), is rather costly when applied on an industrial scale.

It would therefore be desirable to obtain a low-cost, efficient method for forming polysilanes and polygermanes and for the deposition of hydrogenated amorphous silicon, alloys thereof, or hydrogenated amorphous germanium.

The present invention provides an advantage over the prior art methods of forming polysilanes, polygermanes, specifically for forming disilane, and forming films of hydrogenated amorphous silicon, alloys thereof, or hydrogenated amorphous germanium. A commonly used method in the prior art to form hydrogenated amorphous silicon films is by the decomposition of monosilane, $SiH_4$, on the surface of a heated substrate in a DC or RF glow discharge. The glow discharge technique suffers the major disadvantage of extremely low deposition rates, usually on the order of a few angstroms per second. Furthermore, this method suffers from the disadvantage of continuous bombardment of high energy charged particles on the growing a-Si:H surface, thereby introducing defects into the film.

Higher deposition rates may be obtained by using the method of chemical vapor deposition (CVD) through the thermal decomposition of disilane or higher silanes. This method can achieve deposition rates of 100 angstroms per second or higher. Although the CVD method is easier to scale up, and produce better quality films than the glow discharge method due to the absence of charged particles, the CVD method is dependent on the use of high-purity disilane and higher silanes. These precursor gases have not heretofore been available at low cost. In particular, the diluent (or carrier gas) for disilane, such as hydrogen or helium, must be thoroughly purified by gettering and other techniques to minimize contamination in deposited films.

In the present invention high-purity disilane and higher silanes or germanes are produced which allows for the production of high quality hydrogenated amorphous silicon alloys thereof or hydrogenated amorphous germanium, by the CVD method.

The present invention provides further advantages in the aspect of the deposition of hydrogenated amorphous silicon, alloys thereof, or germanium. One of the deposition methods used in the prior art is a static system. The deposited films from static systems are not usually homogeneous in the thickness direction due to variation in the composition of the reaction mixture with time. Furthermore, by use of the static method, residual impurities in the deposition apparatus may be incorporated into the deposited films.

In another method used in the prior art, the low pressure CVD process, the purity of the deposition equipment is extremely critical since any traces of contaminants are readily incorporated into the deposited films. Low pressures (2 to 30 torr) of reactants are used by this method.

Deposition under atmospheric pressure in a gas flow system has been utilized as shown, for example, in U.S. Pat. No. 4,439,463. However, a major disadvantage of the approach is that the precursor disilane and/or higher silanes are first produced by electrical discharge in a separate reaction chamber at low pressures. This necessitates an apparatus which requires maintenance of a pressure differential between the chamber in which the disilane and higher silanes are formed (at low pressures) and the chamber in which the deposition occurs (at atmospheric pressure). This unnecessarily complicates the equipment which must be utilized, and therefore the capital expense of carrying out this process on an industrial scale.

The present invention provides improved deposition methods whereby uniform, high-quality a-Si:H films, alloys thereof, or a-Ge:H may be deposited rapidly and efficiently using a low-cost apparatus.

SUMMARY OF THE INVENTION

The present invention provides a process for producing polygermanes or polysilanes, including disilane, by exposing a gaseous mixture of monosilane (or monogermane) and an inert gas to an electric discharge. The gaseous mixture is maintained at or above atmospheric pressure. The process of the present invention improves the efficiency of polygermane or polysilane formation and provides other advantages as will be apparent from the following description.

The present invention thus provides a method for producing disilane and higher silanes or germanes at a high rate by electric discharge. The gaseous reactants are provided under atmospheric pressure so that the discharge products may be used directly as feedstock for the deposition of hydrogenated amorphous silicon or germanium films.

The invention further provides a process for depositing hydrogenated amorphous silicon or germanium films onto a substrate by exposing the polysilanes formed at atmospheric pressure to the substrate under conditions sufficient to deposit hydrogenated amorphous silicon. The combined steps of forming the polysilanes or polygermanes at atmospheric pressure and depositing hydrogenated amopphous silicon or germanium onto a substrate provide an efficient and low-cost method for forming hydrogenated amorphous silicon or germanium films. This invention further provides a process for the deposition of hydrogenated amorphous silicon alloys by using a mixture of polysilanes and the hydride or fluoride of another element.

To accomplish these processes, the present invention also provides an apparatus for depositing hydrogenated amorphous silicon or alloys thereof, or hydrogenated amorphous germanium onto a substrate comprising a reaction chamber accommodating electrodes for passing a gaseous stream through an electric discharge; communications means connecting the reaction chamber to a deposition chamber, which deposition chamber accommodates the substrate and heating means for heating the substrate within the deposition chamber; control means of controlling the flow of gases from the reaction chamber to the deposition chamber; a plurality of inlet means for introducing additional gaseous reactants into the deposition chamber; control means for controlling the flow of these additional gases; and exhaust means for conducting gases out of the deposition chamber.

DESCRIPTION OF THE INVENTION

Figure 1:
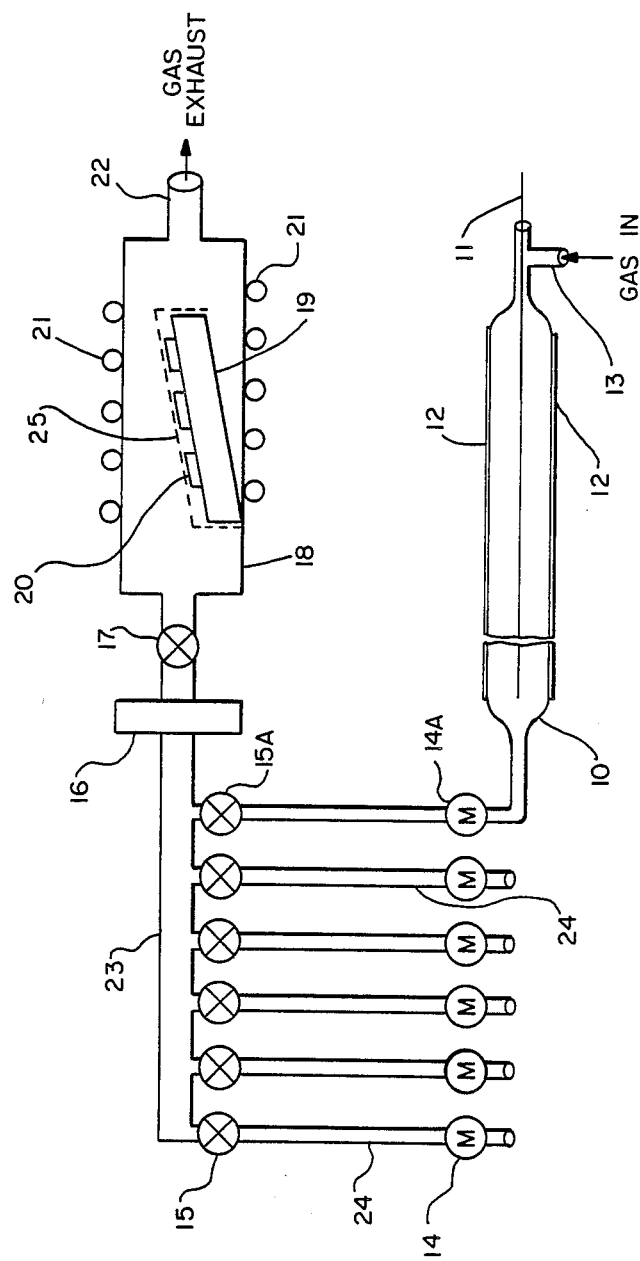
FIG. 1 is a schematic representation of an apparatus useful in accordance with the invention.

In the method of converting monosilane into disilane and higher silanes by silent electric discharge (see Spanier, E. J. and MacDiarmid, A. G., *Inorganic Chemistry*. 432–433 (1962)), the monosilane is typically provided at reduced pressure, usually at ~0.2 atmospheres or less. The dominant process of energy transfer in this method is the collision of monosilane molecules with electrons to form free radicals, such as $SiH_2$ and $SiH_3$ which, respectively, become involved in subsequent reactions to form the polysilanes. Although the power requirement for the reactions forming $SiH_2$ and $SiH_3$ are relatively low (on the order of 2.2 to 4 electron volts, or 0.06 to 0.11 KWHr per mole), the transfer of energy from the low pressure discharge to $SiH_4$ is relatively inefficient. The reaction mixture may be circulated through the discharge many times to achieve a higher yield.

The present invention provides a method whereby the electric discharge is operated at gas pressures of substantially atmospheric pressure or higher. The $SiH_4$, or germane, which cannot maintain discharge readily in a pure state at one atmosphere, is mixed with an inert gas such as helium or argon which has a low ionization energy. Thus, the use of the inert gas/$SiH_4$ mixture at substantially atmospheric pressure or higher, yields a stable electric discharge and can more effectively utilize the power input of the discharge. Preferably, the gas mixture will be provided at room temperature (about 20° C.) or higher. The conversion of the $SiH_4$ into disilane and higher silanes at atmospheric pressures is thus a simpler and more efficient operation than the low-pressure silent discharge method of prior art. Germane can be converted into polygermanes in a similar manner.

The mixture of gases should contain about 50 to 90% by volume of the carrier inert gas. Preferably at least 15% by volume of monosilane or germane will be used. The power input for the discharge, and the rate of discharge, will depend on the shape and dimensions of the discharge reaction chamber, the flow rate of the gases through the chamber, the location of electrodes, etc. However, since the discharge reaction can be accomplished at atmospheric pressure, an advantage of the present invention is that the discharge chamber and connections therewith need not be manufactured to withstand high vacuum. Also, higher pressure allows the use of higher flow rates. To further improve efficiency, the gaseous mixture of inert gas and monosilane or germane can be passed through two or more discharge tubes in series.

Conditions for the deposition of hydrogenated amorphous silicon or germanium under atmospheric pressure in a gas flow system are known. However, the systems of prior art do not attain the unexpectedly high deposition rates obtainable by the present invention due, in part, to the difference of pressure utilized in the reactor forming the disilane, polysilanes or polygermanes and the pressure in the deposition chamber. Furthermore, the high purity of disilanes, polysilanes or polygermanes produced by the present invention enable the direct deposition of hydrogenated amorphous silicon or germanium films utilizing the exit gases of the reaction chamber without further processing.

The disilanes, polysilanes or polygermanes which are provided in a gaseous mixture with inert gas at substantially atmospheric pressure are contacted with a substrate under conditions sufficient to deposit hydrogenated amorphous silicon or germanium. Preferably, the deposition will take place using a chemical vapor deposition process whereby the substrate is heated to a temperature in the range of 460° to 520° C. However, the disilanes, polysilanes or polygermanes prepared by this method can be used for deposition of hydrogenated amorphous silicon or germanium films by methods such as photochemical and glow discharge and for the deposition of hydrogenated amorphous silicon or germanium alloys. A typical feed-gas for deposition of hydrogenated amorphous silicon will contain at least 4% by volume disilane.

Hydrogenated amorphous silicon alloys can be similarly deposited onto a substrate by contacting the substrate with a mixture of polysilanes and a hydride or fluoride of one or more other elements which will form the alloy.

An apparatus utilized for conducting processes according to the present invention is described in FIG. 1. The electric discharge chamber 10 is shown accommodating a centrally disposed electrode 11 and annular electrode 12. Preferably, electrode 11 will be silver or other inert metals and electrode 12 will be aluminum or other metals of high conductivity. The gas mixture comprising the monosilane (or germane) and inert gas is introduced through inlet 13 at a predetermined flow rate and after passing through the discharge area between the electrodes 11 and 12 the mixture containing the polysilanes (or polygermanes) is flowed through meter 14A and valve 15A through filter 16 and valve 17 into the deposition chamber defined by housing 18. Throughout this process the gases within 10 and 18 are maintained at $\geq$ atmospheric pressure. Within the deposition chamber a susceptor 19 supports the substrates 20 to be coated with hydrogenated amorphous silicon, its alloys or hydrogenated amorphous germanium. The susceptor and substrate are heated by an external heating means such as induction coil 21 annularly disposed around the exterior of housing 18. The gases are exhausted from the housing 18 through outlet 22.

The inlet manifold 23 to housing 18 also accommodates a plurality of inlets 24 provided with meters 14 and valves 15, respectively. Each of the inlets 24 can be used to introduce a different gas into manifold 23, depending on particular conditions desired for the deposition process. For example, the inlets 24 can be utilized to introduce helium, hydrogen, arsine, diborane, and the like. In a preferred embodiment utilizing chemical vapor deposition, one of the inlets 24 will be utilized to introduce hydrogen gas.

As shown, the length of the reaction chamber 10 may be varied. Alternatively, a plurality of discharge tubes can be placed in series to enhance the efficiency of the reaction.

The electronic properties of hydrogenated amorphous silicon films deposited in a helium atmosphere are superior to those deposited in a hydrogen atmosphere. The typical photoconductivity, minority carrier diffusion length, and gap state density of a-Si:H films deposited according to the present invention in helium are $6 \times 10^{-5}$ (ohm-cm)$^{-1}$, 0.5–0.6 $\mu$m, and $8 \times 10^{15}$/eV cm$^3$, respectively, while the corresponding typical properties of a-Si:H films deposited in hydrogen are $2 \times 10^{-5}$ (ohm-cm)$^{-1}$, 0.3–0.4 $\mu$m, and $3 \times 10^{16}$/eV cm$^3$, respectively. Hydrogenated amorphous silicon films deposited in helium are also more stable under illumination than those deposited in hydrogen. For example, the photoconductivity of a-Si:H films deposited in helium is reduced to about one-third of its initial value after 500 hours of illumination under simulated AMI conditions while that deposited in hydrogen is degraded to the same degree after about 300 hours of illumination.

A major advantage of the deposition of a-Si:H films by the thermal decomposition of disilane in a helium atmosphere is high deposition rate. The deposition of thick a-Si:H films is required in certain applications, such as photoreceptors. However, a-Si:H films deposited on some substrates will be under high tensile stress, thus causing cracking in thick a-Si:H films. Thus, as another feature of the present invention, it has been found that a-Si:H films deposited on various substrates by plasma-assisted chemical vapor deposition (PACVD) are under compression, while a-Si:H films deposited on such PACVD a-Si:H films (by the thermal decomposition of disilane in helium) are not under tensile stress. Thus, in another embodiment of the present invention, a PACVD interlayer between the substrate and a-Si:H layer is used to avoid cracking when a thick a-Si:H film is deposited by thermal CVD. Crack-free a-Si:H films of 20 $\mu$m thickness are thus typically attainable in this embodiment on glass and metal substrates.

In another embodiment of the present invention, a shutter is utilized to control the deposition of thin a-Si:H films. Because the deposition rate of a-Si:H films in a He atmosphere is relatively high, usually 1 $\mu$m/min. or higher, the deposition of thin a-Si:H films, 0.3 $\mu$m for example, can be difficult to control.

Therefore, referring to FIG. 1, a remotely controlled removable shutter 25 is used to enclose the front surface and four sides of the susceptor 19 during the heating and initial deposition period, so that a-Si:H films can only be deposited on the surface of the shutter. Subsequently, the shutter 25 can be removed for a predetermined time to allow the deposition of a-Si:H films of the required thickness onto the substrate surface. The shutter can be again placed over the susceptor 19 to terminate the deposition of a-Si:H films on the substrate surface. The shutter can be of any convenient design to cover the susceptor and substrate surfaces and is preferably made of quartz. The shutter should be remotely controllable to avoid the need to open the deposition chamber each time the shutter is moved.

The following examples are provided for purposes of illustration. However, the examples are not intended to limit the invention in any way.

EXAMPLE 1

A discharge tube of 2.1 centimeters ID and 80 cm length under a atmospheric pressure of 15% by volume monosilane and 85% by volume helium, a flow rate of about 2 l/min, with a power input of 15 KV at 50 mA, is operated to produce silanes consisting of about 65% (by volume) monosilane, 22% disilane, and 13% trisilane. The ratio of disilane to trisilane can be adjusted by varying the various process parameters, such as residence time of the gas mixture in the discharge chamber, the applied voltage, flow rate, etc. The mixture of monosilane and the inert gas can also be heated before entering the electric discharge to improve the conversion efficiency of monosilane.

EXAMPLE 2

Figure 2:
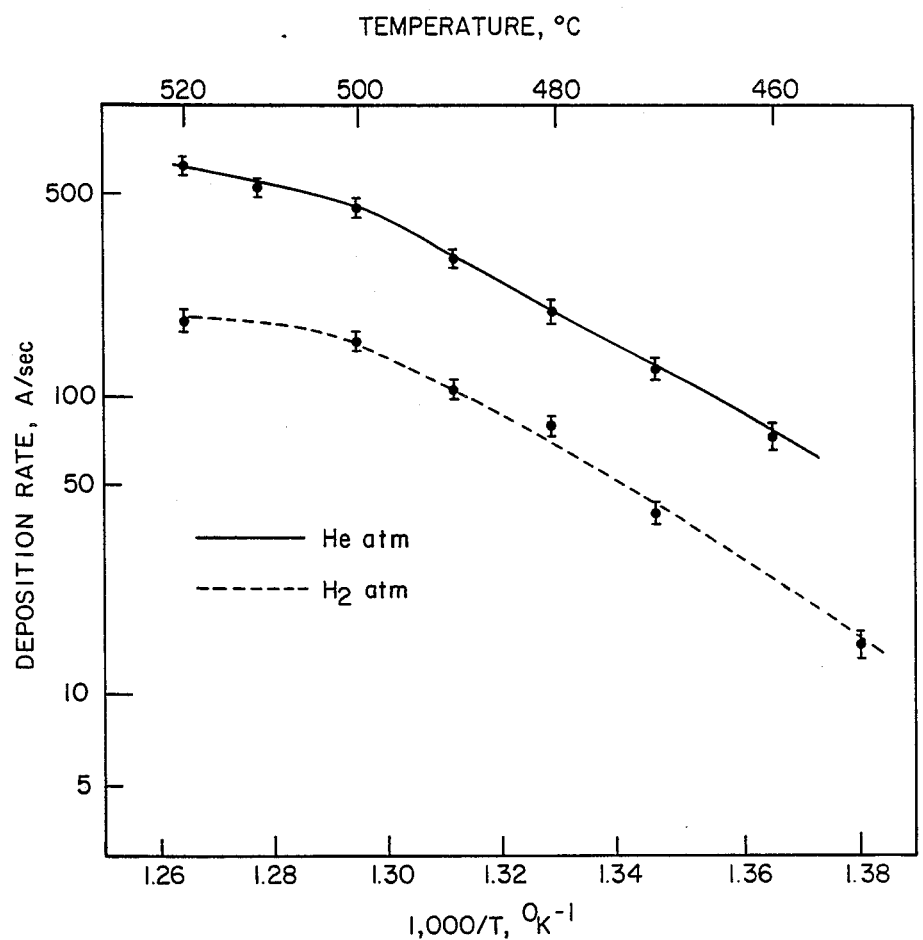
FIG. 2 is a graph of the deposition rate of a-Si:H films in helium and hydrogen atmospheres as a function of temperature.

A mixture of hydrogen and disilane (6% disilane by volume) at atmospheric pressure is flowed at a rate of 4 liters per minute into a deposition chamber as shown in FIG. 1 at temperatures ranging from about 400° to 520° C. The deposition rate-temperature relation is shown in FIG. 2. At a substrate temperature of 500° C., the deposition rate is about 150 Å/sec. By changing the reaction mixture to helium and disilane (6% by volume) at atmospheric pressure, the deposition rate is significantly increased at all temperatures, as shown in FIG. 2.

We claim:

1. A process for depositing hydrogenated amorphous silicon films onto a substrate comprising the steps of
   producing a gaseous polysilane-containing stream by exposure of a gaseous mixture comprising monosilane and inert gas at substantially atmospheric pressure to electric discharge in a first reaction zone
   and contacting said polysilane-containing stream with said substrate in a second reaction zone separated from said first zone under conditions sufficient to deposit hydrogenated amorphous silicon film thereon.

2. A process according to claim 1 wherein said substrate is in the temperature range of 480° to 520° C. during the period of contacting said stream.

3. A process according to claim 2 wherein said stream comprises monosilane and helium.

4. A process according to claim 1 wherein said contacting of said substrate with said stream is under photochemical conditions.

5. A process according to claim 1 wherein said conditions include exposing said stream to a glow discharge.

6. A process according to claim 3 wherein said polysilane-containing stream comprises at least 4% by volume disilane.

7. A process according to claim 1 wherein said compounds comprise polygermanes.

8. A process according to claim 1 wherein said step of contacting said stream with said substrate is conducted under conditions of thermal chemical vapor deposition.

9. A process according to claim 8 further comprising the step of depositing an a-Si:H interlayer by plasma-assisted chemical vapor deposition upon said substrate prior to depositing said hydrogenated amorphous silicon film by thermal chemical vapor deposition.

10. A process for the deposition of a hydrogenated amorphous silicon alloy onto a substrate comprising the step of contacting a gaseous mixture of polysilane and a hydride or fluoride of one or more other elements which comprise said alloy.

* * * * *